(12) United States Patent
Cho et al.

(10) Patent No.: US 8,841,960 B2
(45) Date of Patent: Sep. 23, 2014

(54) CLOCK SIGNAL GENERATING CIRCUIT AND POWER SUPPLY INCLUDING THE SAME

(71) Applicant: Fairchild Korea Semiconductor Ltd., Bucheon (JP)

(72) Inventors: Kunhee Cho, Seoul (KR); Donghwan Kim, Bucheon (KR); Young-je Lee, Bucheon (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 0 days.

(21) Appl. No.: 14/089,063

(22) Filed: Nov. 25, 2013

(65) Prior Publication Data

US 2014/0077859 A1    Mar. 20, 2014

Related U.S. Application Data

(62) Division of application No. 13/399,085, filed on Feb. 17, 2012, now Pat. No. 8,610,480.

(30) Foreign Application Priority Data

Jul. 1, 2011 (KR) .................. 10-2011-0065650

(51) Int. Cl.
    *G06F 1/04* (2006.01)
    *H03K 5/14* (2014.01)
    *H03K 3/01* (2006.01)
    *H03L 7/00* (2006.01)

(52) U.S. Cl.
    CPC .. *H03K 3/01* (2013.01); *H03K 5/14* (2013.01); *H03L 7/00* (2013.01)

USPC .......... 327/540; 327/538; 327/291; 327/113; 327/160; 327/360

(58) Field of Classification Search
    USPC .......... 327/291, 113, 116, 119, 120, 121, 99, 327/144, 151, 152, 153, 160, 162, 295, 356, 327/360
    See application file for complete search history.

(56) References Cited

U.S. PATENT DOCUMENTS

| 4,025,866 A | 5/1977 | Fletcher et al. |
| 6,107,846 A | 8/2000 | Shinmori |

(Continued)

OTHER PUBLICATIONS

Jong Tae Hwang, et al. "A Simple LED Lamp Driver IC with Intelligent Power-Factor Correction", ISSCC 2011 / Session 13 / Analog Techniques / 13.1, pp. 236-238, 2011 IEEE International Solid-State Circuits Conference.
Advance Program—ISSCC 2011 IEEE International Solid-State Circuits Conference, Feb. 20-24, 2011, pp. 1-85, San Francisco Marriott Marquis Hotel, California USA.

*Primary Examiner* — Lincoln Donovan
*Assistant Examiner* — Jung H Kim
(74) *Attorney, Agent, or Firm* — Okamoto & Benedicto LLP

(57) ABSTRACT

The present invention relates to a clock signal generating circuit and a power supply including the same. The present invention includes: a counter for counting one period of an input clock signal by using a reference clock signal, and generating a count signal; and a clock signal generator for receiving the count signal and the reference clock signal, dividing the count signal to generate a quotient and a remainder, setting the quotient as a reference period of an output clock signal, and distributing and disposing the remainder to the output clock signal with a plurality of periods occurring for one period of the input clock signal.

9 Claims, 9 Drawing Sheets

(56) References Cited

U.S. PATENT DOCUMENTS

| | | |
|---|---|---|
| 6,346,833 B1 | 2/2002 | Kuroki |
| 6,876,236 B2 | 4/2005 | Aman |
| 6,906,562 B1 | 6/2005 | Nguyen |
| 7,132,863 B2 * | 11/2006 | Wadhwa et al. ............ 327/116 |
| 7,750,616 B2 | 7/2010 | Liu |
| 2004/0000935 A1 | 1/2004 | El-Kik |
| 2006/0273833 A1 | 12/2006 | Chen |
| 2009/0132884 A1 * | 5/2009 | Suda et al. ............ 714/744 |

* cited by examiner

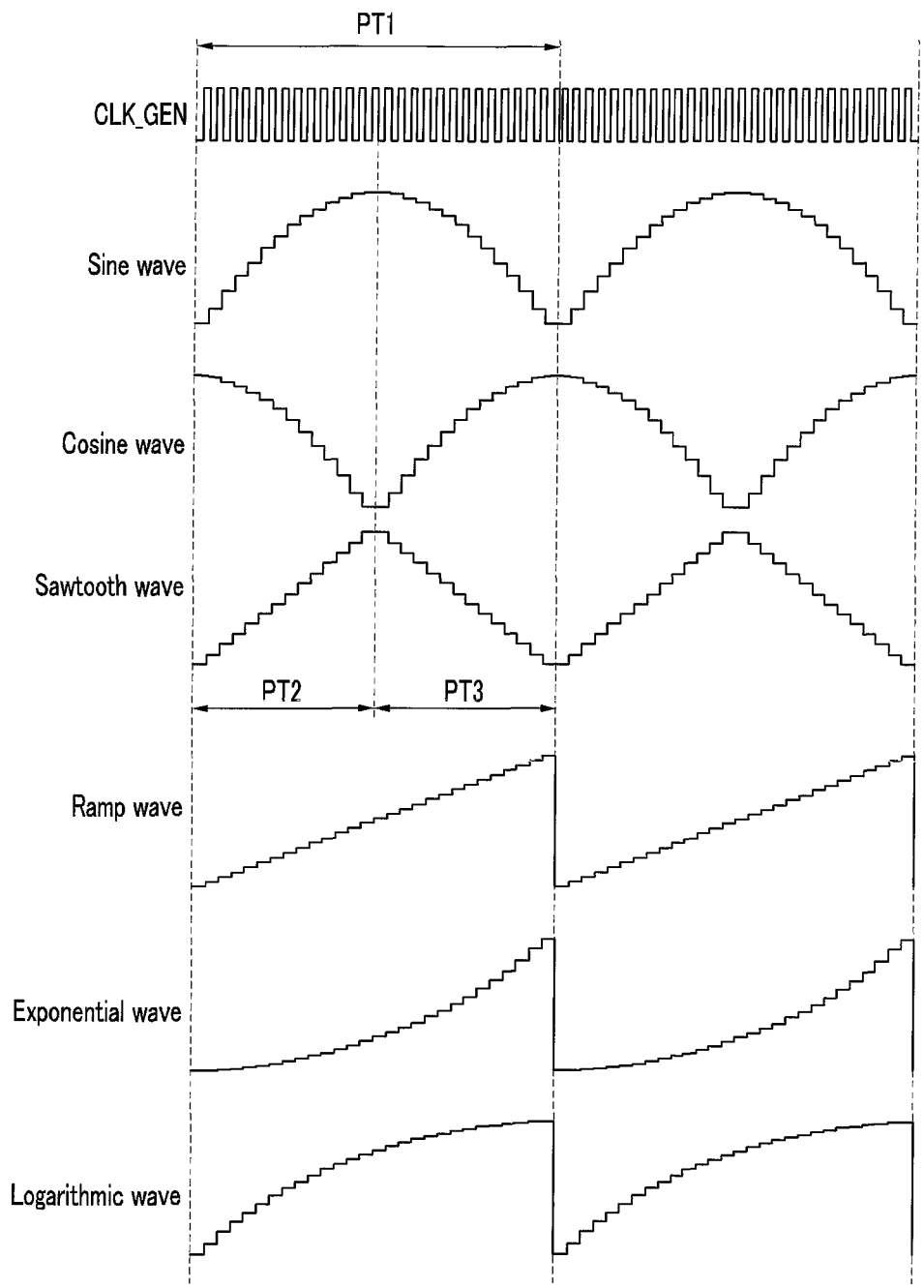

CLOCK SIGNAL GENERATING CIRCUIT AND POWER SUPPLY INCLUDING THE SAME

CROSS-REFERENCE TO RELATED APPLICATION

This application is a divisional of U.S. patent application Ser. No. 13/399,085, filed on Feb. 17, 2012, which claims priority to and the benefit of Korean Patent Application No. 10-2011-0065650 filed in the Korean Intellectual Property Office on Jul. 1, 2011. The just mentioned disclosures are incorporated herein by reference in their entirety.

BACKGROUND (a) Field

Embodiments of the present invention relate to a clock signal generating circuit and a power supply including the same.

(b) Description of the Related Art

A frequency synthesizer for changing a frequency of an input signal into a predetermined output frequency and outputting the same uses a phase locked loop.

FIG. 1 shows a frequency synthesizer using a conventional phase locked loop.

As shown in FIG. 1, the frequency synthesizer 1 includes a phase detector 2, a pulse-voltage converter 3, a voltage controlled oscillator 4, and a divider 5.

The voltage controlled oscillator 4 generates an output signal having a frequency following an input voltage. The divider 5 divides the output signal and feeds it back to the phase detector 2 so as to change the output frequency into a frequency of the input signal.

The phase detector 2 compares the fed output signal and the input signal and generates a pulse signal according to a phase difference between the two signals.

The pulse-voltage converter 3 controls the voltage that is input to the voltage controlled oscillator 4 according to the pulse signal to control the frequency of the output signal to be equal to the output frequency.

The pulse-voltage converter 3 includes a charge pump and a loop filter, and the loop filter includes a capacitor that is charged and discharged by charges transmitted by the charge pump or charges transmitted to the charge pump.

In this instance, as the frequency of the input signal becomes lower, the size of the capacitor of the loop filter is problematically increased. That is, the conventional frequency synthesizer requires a large capacitor so as to change the frequency of the input signal in a slow frequency bandwidth into the output frequency. When the capacitor is large, it is impossible to integrate it with the semiconductor technology.

In order to solve this, a digital phase locked loop can be used. However, this method requires several periods of the input signal in order to lock the phase, and the several periods amount to a very long time when the frequency of the input signal is low.

The above information disclosed in this Background section is only for enhancement of understanding of the background of the invention and therefore it may contain information that does not form the prior art that is already known in this country to a person of ordinary skill in the art.

SUMMARY

Embodiments of the present invention have been made in an effort to provide circuits for changing a frequency of an input signal with a low frequency bandwidth into an output frequency without increasing the size of a capacitor.

An exemplary embodiment of the present invention provides a clock signal generating circuit including: a counter for counting one period of an input clock signal by using a reference clock signal, and generating a count signal; and a clock signal generator for receiving the count signal and the reference clock signal, dividing the count signal to generate a quotient and a remainder, setting the quotient as a reference period of an output clock signal, and distributing and disposing the remainder to the output clock signal with a plurality of periods occurring for one period of the input clock signal.

The clock signal generator sets a plurality of periods of the reference clock signal that correspond to the quotient as a reference period of the output clock signal, and sets a period that corresponds to the remainder from among the plurality of periods of the output clock signal occurring for one period of the input clock signal as a modulation period that is an addition of a period of the reference clock signal to the reference period.

The clock signal generator includes: a divider for generating the quotient and the remainder by dividing the count signal by a constant that corresponds to an output frequency of the output clock signal; a pulse signal generator for generating a pulse signal by using the reference period following the quotient that is input in synchronization with a time when one period of the input clock signal begins; a modulator for receiving the remainder and the pulse signal, and controlling distribution and disposal of the remainder to the output clock signal according to a result of performing a modulation operation for each period of the pulse signal; a delay unit for delaying the period of the pulse signal by one period of the reference clock signal, and outputting the same; and a selector for selecting one of a pulse signal of the pulse signal generator and a pulse signal of the delay unit according to control by the modulator, and outputting it as the output clock signal.

The pulse signal generator generates the pulse signal when the reference period is passed through each period generation time of the output clock signal.

The modulator performs the modulation operation for each period of the pulse signal, and generates a modulation control signal for selecting a period for distributing and disposing the remainder from among a plurality of periods of the output clock signal of the input clock signal according to the modulation result, and the selector selects one of a pulse signal of the pulse signal generator and a pulse signal of the delay unit according to the modulation control signal.

The modulator generates a modulation constant by dividing the remainder by the constant, generates a sum of modulation constants by adding the modulation constants for each period of the pulse signal, and generates a modulation control signal for selecting a period of the output clock signal when the sum of the modulation constants is greater than a predetermined value as the modulation period according to the modulation operation.

The counter generates a sync signal that is synchronized with a period start time of the input clock signal, and the clock signal generator sets the quotient as a reference period for each period of the input clock signal according to the sync signal, and distributes and disposes the remainder to output clock signals of the periods.

The clock signal generator identifies each period of the input clock signal by using the sync signal, generates a quotient and a remainder that correspond to the previous period of the input clock signal by dividing the count signal that corresponds to the previous period at a new period time of the input clock signal, sets a plurality of periods of the reference clock signal corresponding to the quotient as a reference period for the output clock signal, and sets the period that corresponds to the remainder from among a plurality of periods of the output clock signal occurring for one period of the input clock signal as a modulation period that is an addition of one period of the reference clock signal to the reference period.

The clock signal generator includes: a divider for generating the quotient and the remainder by dividing the count signal by a constant that corresponds to an output frequency of the output clock signal; a pulse signal generator for generating a pulse signal by using the reference period that follows the quotient that is input in synchronization with a time when the sync signal is generated; a modulator for receiving the remainder in synchronization with the time when the sync signal is generated, performing a modulation operation for each period of the pulse signal, and thereby controlling distribution and disposal of the remainder to the output clock signal according to the modulation operation result; a delay unit for delaying a period of the pulse signal by one period of the reference clock signal, and outputting the same; and a selector for selecting one of a pulse signal of the pulse signal generator and a pulse signal of the delay unit according to control by the modulator, and outputting the same to the output clock signal.

The pulse signal generator generates the pulse signal when the reference period has passed starting from each of the period generation time of the output clock signal.

The modulator performs the modulation operation for each period of the pulse signal starting from the time when the sync signal is generated and generates a modulation control signal for selecting a period of the output clock signal to which the remainder will be distributed and disposed according to the modulation result, and the selector selects one of a pulse signal of the pulse signal generator and a pulse signal of the delay unit according to the modulation control signal.

The clock signal generating circuit further includes a latch for storing the count signal for each period of the input clock signal, and outputting the count signal to the clock signal generator in synchronization with the input clock signal.

Another embodiment of the present invention provides a power supply for generating a reference signal by using an input clock signal following a full wave rectified voltage, and controlling a switching operation of a power switch according to the reference signal.

The power supply includes: a voltage sensor for generating a sense voltage corresponding to the full wave rectified voltage; a zero crossing detector for generating the input clock signal according to a result of comparing the sense voltage and a predetermined zero crossing reference voltage; and a clock signal generating circuit for generating a quotient and a remainder by dividing a count signal following a result of counting one period of the input clock signal by using a reference clock signal, setting the quotient as a reference period of the output clock signal, and distributing and disposing the remainder to an output clock signal of a plurality of periods occurring for one period of the input clock signal.

The power supply further includes: a pattern generator for generating a digital reference signal appropriate for a pattern of the reference signal by using the output clock signal; and a digital-to-analog converter for generating the reference signal according to the digital reference signal.

The pattern generator includes a lookup table for storing a pattern of the reference signal, and generates the digital reference signal configured with a digital value for indicating a voltage following the pattern of the reference signal for each period of the output clock signal by using the lookup table.

The power supply further includes a PWM controller for controlling the switching operation according to a result of comparing a switching sensing voltage that corresponds to the current flowing to the power switch and the reference signal.

The voltage sensor generates a sense voltage that corresponds to a full wave rectified voltage by using a voltage at an input terminal of the power switch.

According to the embodiments of the present invention, a clock signal generating circuit for generating clock signals following a rectified input voltage without using a resistor and a large capacitor, and a power supply for generating a reference signal by using the clock signal generating circuit, are provided.

BRIEF DESCRIPTION OF THE DRAWINGS

FIG. 9 shows a waveform diagram of patterns of a reference signal according to an exemplary embodiment of the present invention.

DETAILED DESCRIPTION OF THE EMBODIMENTS

Figure 1:
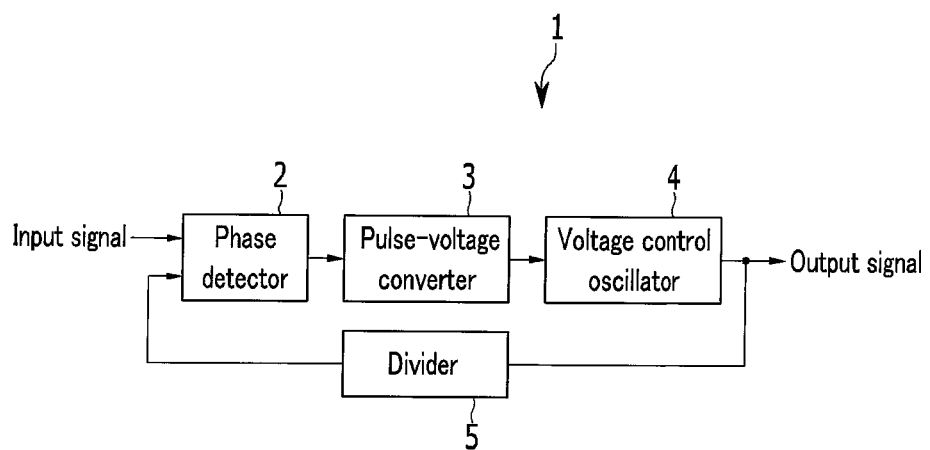
FIG. 1 shows a frequency synthesizer using a phase locked loop.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Figure 2:
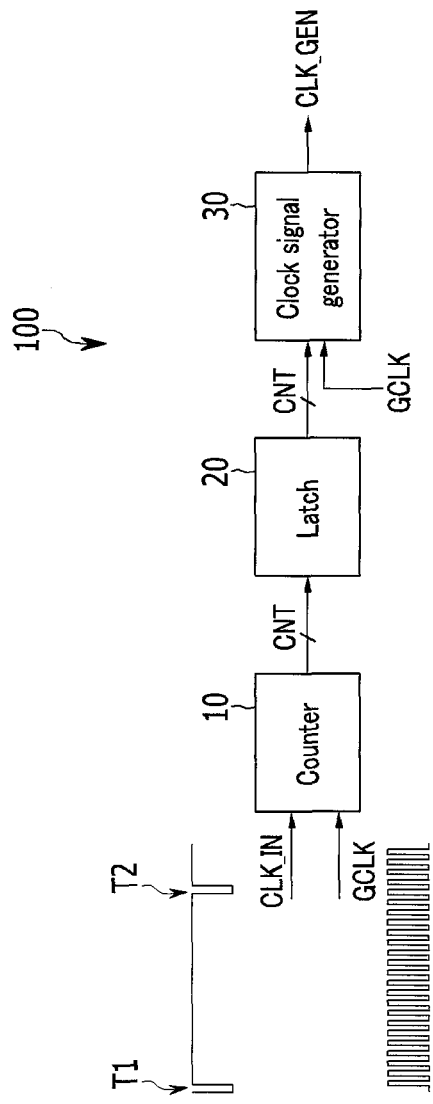
FIG. 2 shows a clock signal generating circuit according to an exemplary embodiment of the present invention.

FIG. 2 shows a clock signal generating circuit according to an exemplary embodiment of the present invention.

The clock signal generating circuit 100 receives an input clock signal (CLK_IN), senses a period of the input clock signal (CLK_IN) to divide it with a predetermined ratio (1/L), and generates an output clock signal (CLK_GEN) that is synchronized with the input clock signal (CLK_IN) and L times the frequency.

In this instance, the clock signal generating circuit 100 receives a reference clock signal (GCLK) together with the input clock signal (CLK_IN), counts the period of the input clock signal (CLK_IN), and generates an output clock signal (CLK_GEN). The reference clock signal (GCLK) has a frequency that is greater than that of the input clock signal (CLK_IN), and when the frequency becomes greater, the period of the input clock signal (CLK_IN) can be measured more accurately.

The frequency of the input clock signal (CLK_IN) will be called an input frequency, and the frequency of the output clock signal (CLK_GEN) will be called an output frequency.

As shown in FIG. 2, the clock signal generating circuit 100 includes a counter 10, a latch 20, and a clock signal generator 30.

The counter 10 counts a single period of the input clock signal (CLK_IN) by using the reference clock signal (GCLK). In detail, the counter 10 counts an interval from a falling edge (or a rising edge) T1 of the input clock signal (CLK_IN) to a next falling edge (or a next rising edge) T2 by using the reference clock signal (GCLK).

Here, the counting process by using the reference clock signal (GCLK) signifies that the counter 10 counts the period of the reference clock signal (GCLK) during the interval T1-T2. The counter 10 generates the count result as an n-bit signal to generate a count signal (CNT).

For example, when the input clock signal (CLK_IN) is 100 Hz, one period is 0.01 seconds. When the reference clock signal (GCLK) is 100 kHz, one thousand reference clock signals (GCLK) are generated for one period of the input clock signal (CLK_IN). The count signal (CNT) represents an n-bit signal (e.g., 1111111000) for showing the number 1000.

The counter 10 generates a sync signal (SYNC) that is synchronized with a time when the period of the input clock signal (CLK_IN) begins. That is, when the counter 10 counts the interval (T1-T2) between the falling edge of the input clock signal (CLK_IN) and a subsequent falling edge by using the reference clock signal (GCLK), it generates a sync signal (SYNC) that is a pulse occurring in synchronization with the generation time T1 of the falling edge. The generation time of the sync signal (SYNC) will be described later.

The latch 20 stores a count signal (CNT) for each period of the input clock signal (CLK_IN), and transmits the count signal (CNT) to the clock signal generator 30 in synchronization with the input clock signal (CLK_IN). In detail, the latch 20 and the clock signal generator 30 are operable in synchronization with the sync signal (SYNC).

That is, when a sync signal (SYNC) is generated in synchronization with a falling edge of a new input clock signal (CLK_IN), the latch 20 transmits the stored count signal (CNT) to the clock signal generator 30, and the clock signal generator 30 receives the count signal (CNT) and generates an output clock signal (CLK_GEN). Therefore, the latch 20 and the clock signal generator 30 are operable in synchronization with the input clock signal (CLK_IN), and the count signal (CNT) according to the result of counting the input clock signal (CLK_IN) is transmitted to the clock signal generator 30 when an input clock signal (CLK_IN) of the next period is generated.

The clock signal generator 30 receives the count signal (CNT) and the reference clock signal (GCLK), divides the count signal (CNT) to generate a quotient and a remainder, sets the quotient as a reference period of the output clock signal (CLK_GEN), and assigns the remainder to a plurality of periods of the output clock signal (CLK_GEN) occurring for a period of the input clock signal (CLK_IN).

The reference period represents a period of the output clock signal (CLK_GEN) when a plurality of periods of the reference clock signal (GCLK) corresponding to the quotient are set to be a period of the output clock signal (CLK_GEN). The clock signal generator 30 sets a plurality of periods that correspond to the remainder from among a plurality of periods of the output clock signal (CLK_GEN) occurring for a period of the input clock signal (CLK_IN) as a modulation period, an addition of a period of the reference clock signal (GCLK) to the reference period. The clock signal generator 30 counts the period of the reference clock signal (GCLK) a number of times that corresponds to the quotient to set the reference period of the output clock signal.

Accordingly, an error that is generated when the remainder is concentrated to a specific period from among a plurality of periods of the output clock signal occurring for one period of the input clock signal (CLK_IN) is prevented.

In this instance, the quotient and the remainder are updated for each period of the input clock signal (CLK_IN), and the quotient and the remainder are expressed for each period of the reference clock signal (GCLK). The clock signal generator 30 identifies each period of the input clock signal (CLK_IN) according to the sync signal (SYNC). That is, a start of a new period is sensed when the sync signal (SYNC) is generated and a count signal (CNT) of the previous period is divided to generate the quotient and the remainder.

Figure 3:
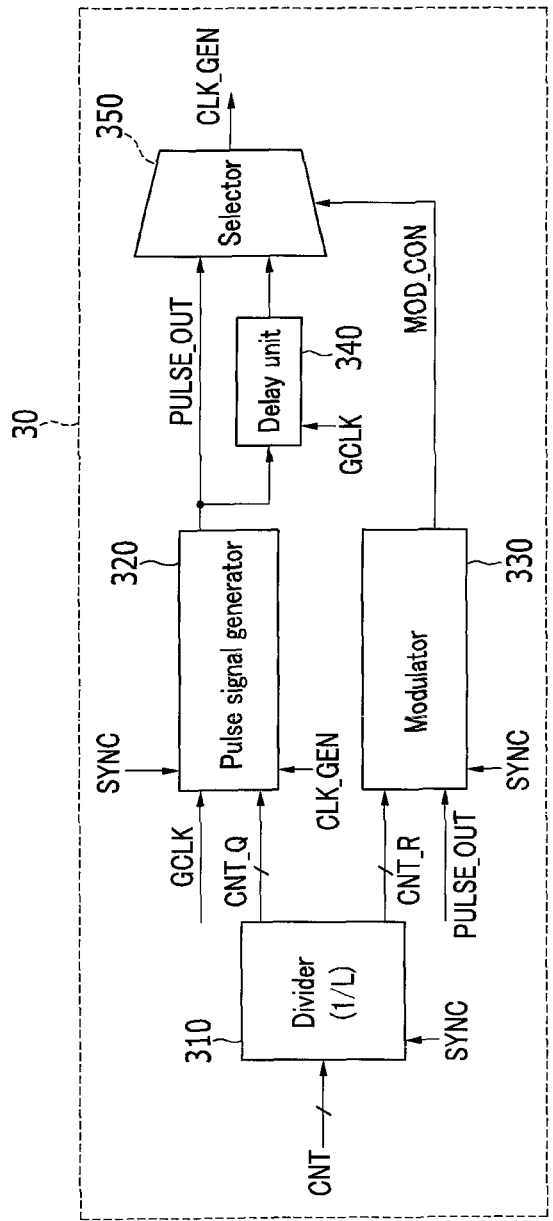
FIG. 3 shows a clock signal generator according to an exemplary embodiment of the present invention.

A detailed description on the clock signal generator 30 will be provided referring to FIG. 3.

FIG. 3 shows a clock signal generator according to an exemplary embodiment of the present invention.

As shown in FIG. 3, the clock signal generator 30 includes a divider 310, a pulse signal generator 320, a modulator 330, a delay unit 340, and a selector 350.

The divider 310, the pulse signal generator 320, and the modulator 330 recognize the count signal (CNT), the quotient (CNT_Q), and the remainder (CNT_R) for each period of the input clock signal (CLK_IN) according to the sync signal (SYNC). For example, when the sync signal (SYNC) is a high-level pulse signal, the divider 310, the pulse signal generator 320, and the modulator 330 are operated according to the count signal (CNT), the quotient (CNT_Q), and the remainder (CNT_R) that are input when the pulse signal is generated.

The divider 310 divides the count signal (CNT) by a constant (L) that corresponds to the output frequency of the output clock signal (CLK_GEN) to generate a quotient (CNT_Q) and a remainder (CNT_R).

For example, when the constant (L) is 64, an output frequency for generating 64 periods of the output clock signal (CLK_GEN) for one period of the input clock signal (CLK_IN) is set. The divider 310 divides the count signal (CNT) that is input when the sync signal (SYNC) is generated by 64. When the count signal (CNT) is 1000, the quotient (CNT_Q) is 15 and the remainder (CNT_R) is 40.

The pulse signal generator 320 generates a pulse signal (PULSE_OUT) by using the reference period following the quotient (CNT_Q) that is input in synchronization with the time when one period of the input clock signal (CLK_IN) begins. The pulse signal generator 320 generates the pulse signal (PULSE_OUT) when the reference period has passed from the time when each period of the output clock signal (CLK_GEN) is generated.

The reference period represents a period in which the reference clock signal (GCLK) corresponding to the quotient (CNT_Q) is generated. The reference period is determined by the quotient (CNT_Q) when one period of the input clock signal (CLK_IN) begins. For example, when the quotient (CNT_Q) is 15, the 15 periods of the reference clock signal (GCLK) are set to be the reference period.

A sync signal (SYNC) is generated in synchronization with the time when an input clock signal (CLK_IN) of a new period is generated (e.g., a falling edge.)

The pulse signal generator 320 generates a pulse signal (PULSE_OUT) by using the reference period that corresponds to the quotient (CNT_Q) that is input when the sync signal (SYNC) is generated. The quotient (CNT_Q) that is input when the sync signal (SYNC) is generated represents the quotient (CNT_Q) of the count signal (CNT) that corresponds to the input clock signal (CLK_IN) of the previous period.

The pulse signal generator 320 repeatedly generates the pulse signal (PULSE_OUT) of a new period when the reference period has passed from each generation time of the period of the output clock signal (CLK_GEN). That is, the pulse signal (PULSE_OUT) is repeatedly generated in synchronization with the periodical generation time of the output clock signal (CLK_GEN) according to the reference period that corresponds to the input clock signal (CLK_IN) of the previous period before the input clock signal (CLK_IN) of a new period is finished.

The modulator 330 receives the remainder (CNT_R) and the pulse signal (PULSE_OUT) that are input in synchronization with the time when the sync signal (SYNC) is generated, and controls the operation for distributing and assigning the remainder (CNT_R) to the output clock signal (CLK_GEN) according to the result of performing a modulation operation for each period of the pulse signal (PULSE_OUT).

When the remainder (CNT_R) is distributed and assigned to the output clock signal (CLK_GEN), an output clock signal (CLK_GEN) having a modulation period that is longer than the reference period from among a plurality of periods of the output clock signal (CLK_GEN) occurring for one period of the input clock signal (CLK_IN) by one period of the reference clock signal (GCLK) is generated. That is, the number of periods having the modulation period from among a plurality of periods of the output clock signal (CLK_GEN) occurring for one period of the input clock signal (CLK_IN) corresponds to the remainder (CNT_R).

For example, when an output clock signal (CLK_GEN) of 64 periods is generated, the quotient (CNT_Q) is 15 and the remainder (CNT_R) is 40 for one period of the input clock signal (CLK_IN), and 40 periods of the 64 periods of the output clock signal (CLK_GEN) correspond to 16 periods of the reference clock signal (GCLK).

In this instance, the modulation operation represents an operation that is performed when the modulator 330 irregularly selects the period of the output clock signal (CLK_GEN) for distributing and disposing the remainder (CNT_R). For example, the modulation operation can be performed according to a delta-sigma modulation method.

The modulator 330 receives the remainder (CNT_R) and the pulse signal (PULSE_OUT), performs the modulation operation for each period of the pulse signal (PULSE_OUT), and generates a modulation control signal (MOD_CON) for selecting a period of the output clock signal (CLK_GEN) for distributing and disposing the remainder (CNT_R) according to the modulation operation result. Then, the remainder (CNT_R) is distributed and disposed according to the modulation result for a plurality of periods of the output clock signal (CLK_GEN) occurring for one period of the input clock signal (CLK_IN).

In detail, the modulator 330 receives the remainder (CNT_R) of a previous period count signal (CNT) of the input clock signal (CLK_IN) when a sync signal (SYNC) is generated. The modulator 330 performs the modulation operation for each period of the pulse signal (PULSE_OUT) starting from the time when the sync signal (SYNC) is generated. The modulator 330 generates an enable-level modulation control signal (MOD_CON) for selecting the modulation period when it selects the corresponding period as a modulation period according to the modulation result. When the corresponding period is selected as the reference period according to the modulation result, the modulator 330 generates a disable-level modulation control signal (MOD_CON) for selecting the reference period.

The modulation operation will now be exemplified.

The modulator 330 divides the remainder (CNT_R) by the number of output clock signals (CLK_GEN) that are generated for one period of the input clock signal (CLK_IN). The divided value will be called a modulation constant. The number of periods of the output clock signal (CLK_GEN) occurring for one period of the input clock signal (CLK_IN) corresponds to the constant (L). The modulator 330 adds the modulation constant for each period of the pulse signal (PULSE_OUT).

When the sum of the modulation constants becomes greater than 1, the modulator 330 generates an enable-level modulation control signal (MOD_CON) for selecting the period of the output clock signal (CLK_GEN) for the modulation period. In this instance, the modulator 330 subtracts 1 from the sum of the modulation constant, and adds the modulation constant to the subtracted result in the next period of the pulse signal (PULSE_OUT). The remainder (CNT_R) is distributed and disposed by repeating the above-noted operation.

In detail, when the remainder (CNT_R) 40 is divided by 64, the divided value that is the modulation constant is 0.625. Addition of 0.625 twice produces 1.25. That is, the second period of the output clock signal (CLK_GEN) is selected as a modulation period, and generates an enable-level modulation control signal (MOD_CON). In the third period of the pulse signal (PULSE_OUT), 0.625 is added to 0.25 (=1.25-1) to be 0.875. Therefore, the modulator 330 selects the third period of the output clock signal (CLK_GEN) as a reference period, and generates a disable-level modulation control signal (MOD_CON).

In the fourth period of the pulse signal (PULSE_OUT), 0.625 is added to 0.875 to be 1.5. The modulator 330 generates an enable-level modulation control signal (MOD_CON) for selecting the fourth period of the output clock signal (CLK_GEN) as a modulation period. In a like manner, the remainder (CNT_R) 40 is randomly distributed and disposed to the output clock signal (CLK_GEN) of 64 periods.

The above-noted method represents an example for better understanding of the present invention, and the present invention is not limited thereto.

The delay unit 340 transmits the pulse signal (PULSE_OUT) to the selector 350 when the period of the pulse signal (PULSE_OUT) is delayed by one period of the reference clock signal (GCLK).

The selector 350 determines an output time of the pulse signal (PULSE_OUT) according to the modulation control signal (MOD_CON). The selector 350 selects an output of the pulse signal generator 320 or an output of the delay unit 340 according to the modulation control signal (MOD_CON) and outputs it to the output clock signal (CLK_GEN). In detail, the selector 350 outputs a pulse signal (PULSE_OUT) output by the delay unit 340 when the modulation control signal (MOD_CON) is in the enable level, and it outputs a pulse signal (PULSE_OUT) output by the pulse signal generator 320 when the modulation control signal (MOD_CON) is in the disable level.

Figure 4:
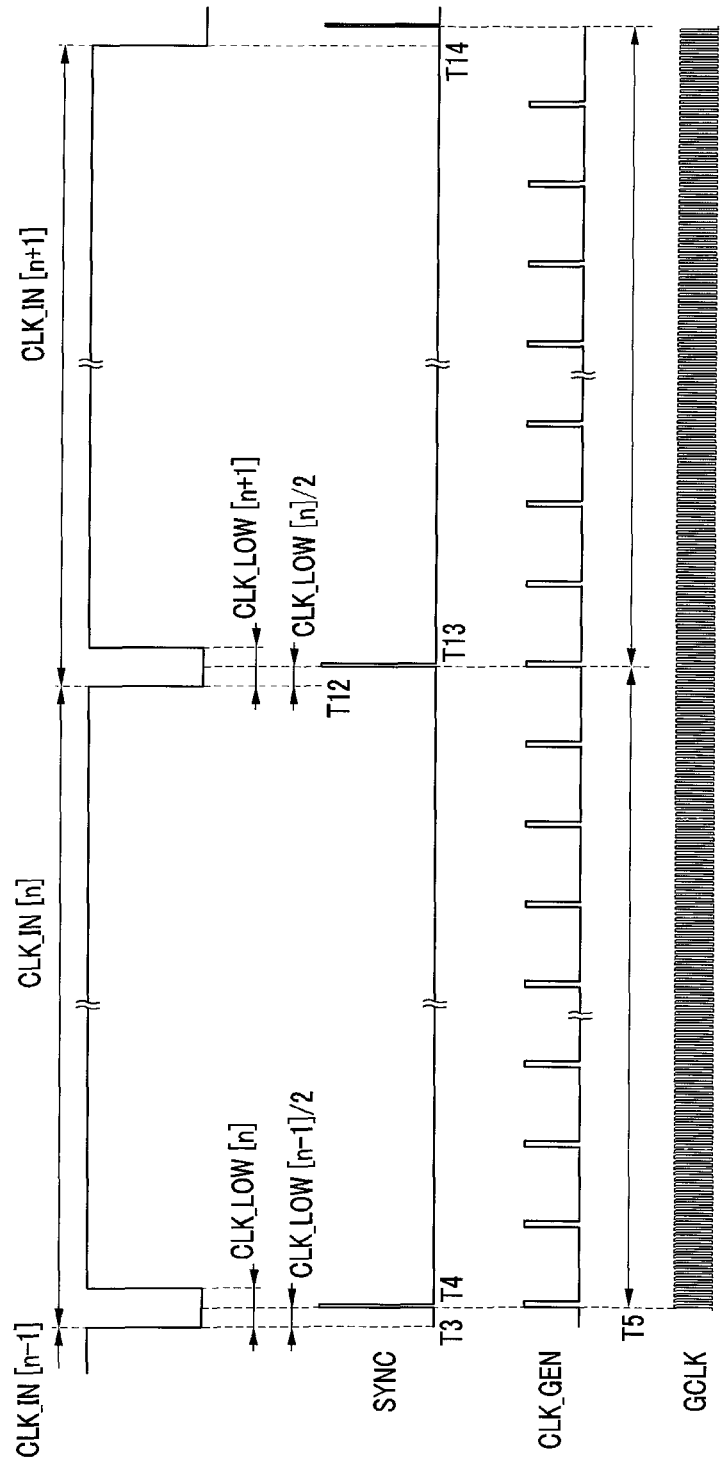
FIG. 4 shows a waveform diagram of an input clock signal, a sync signal, a reference clock signal, and an output clock signal according to an exemplary embodiment of the present invention.
Figure 5:
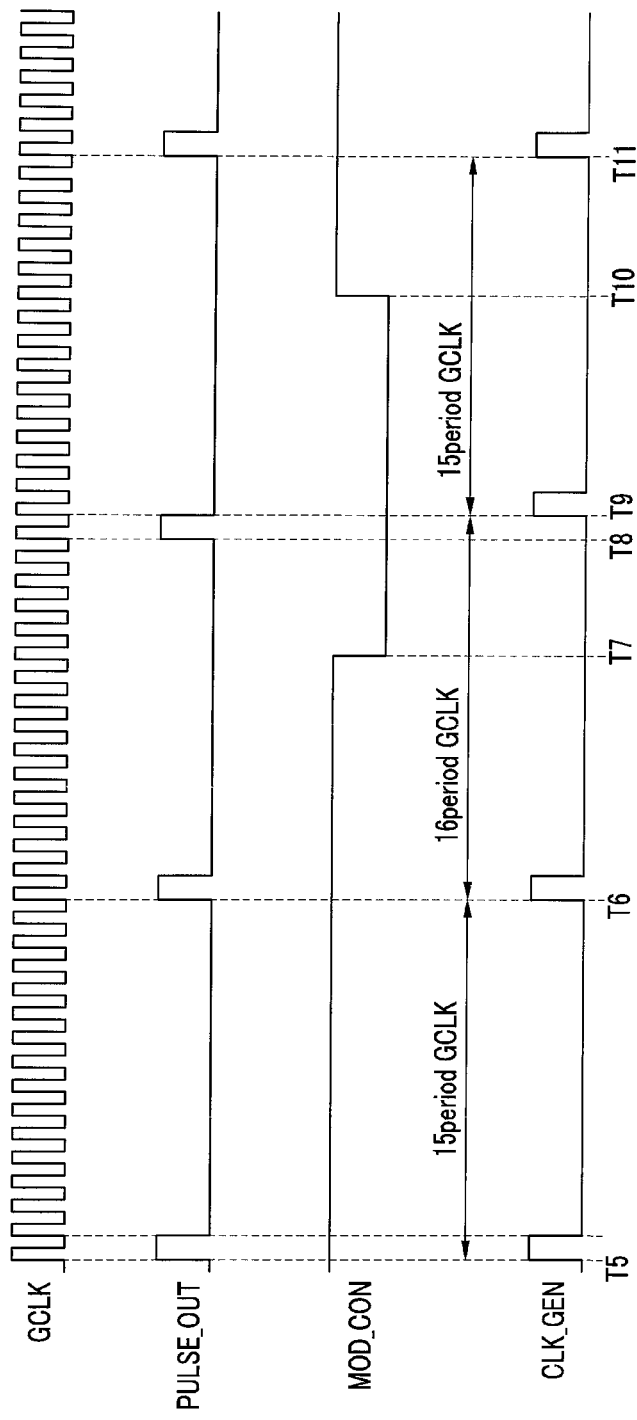
FIG. 5 shows a waveform diagram of a reference clock signal, a pulse signal, a modulation control signal, and an output clock signal according to an exemplary embodiment of the present invention.

Referring to FIG. 4 and FIG. 5, a clock signal generating circuit according to an exemplary embodiment of the present invention will now be described.

FIG. 4 shows a waveform diagram of an input clock signal, a sync signal, a reference clock signal, and an output clock signal according to an exemplary embodiment of the present invention.

FIG. 5 shows a waveform diagram of a reference clock signal, a pulse signal, a modulation control signal, and an output clock signal according to an exemplary embodiment of the present invention.

At the time T3, a falling edge of the input clock signal (CLK_IN[n]) is generated. The counter 10 generates a sync signal (SYNC) at the time T4. The interval T3-T4 is set to be an interval that is generated by dividing the low level interval (CLK_LOW[n−1]) of the previous input clock signal (CLK_IN[n−1]) by two. However, the present invention is not restricted thereto, and it can be modified depending on the device to which the clock signal generating circuit is applied.

The counter 10 starts to count the input clock signal (CLK_IN[n]) by using the reference clock signal (GCLK) at the time T3. Also, the counter 10 generates a count signal (CNT[n−1]) according to the result of counting the previous input clock signal (CLK_IN[n−1]) to the time T3.

The divider 310 generates a quotient (CNT[n−1]_Q) and a remainder (CNT[n−1]_R) by dividing the count signal (CNT[n−1]) that is input at the time T4 when the sync signal (SYNC) is generated.

The pulse signal generator 320 generates a pulse signal (PULSE_OUT) that has the quotient (CNT[n−1]_Q) that is input at the time T4 as a reference period. The modulator 330 distributes and disposes the remainder (CNT[n−1]_R). A generation pattern of the pulse signal (PULSE_OUT) and a remainder distribution and disposal pattern will be described with reference to FIG. 5.

As shown in FIG. 5, the pulse signal generator 320 generates a pulse signal (PULSE_OUT) having a reference period at the time T5 coming after the time T3. A pulse width of the pulse signal (PULSE_OUT) corresponds to one period of the reference clock signal (GCLK).

The first output clock signal (CLK_GEN) has a reference period according to the result of performing the modulation operation by the modulator 330. Therefore, the modulation control signal (MOD_CON) is a high level, which is a disable level. The selector 350 outputs the pulse signal (PULSE_OUT) output by the pulse signal generator 320 to the output clock signal (CLK_GEN) according to the high-level modulation control signal (MOD_CON) at the time T5. The pulse signal generator 320 generates a second pulse signal (PULSE_OUT) at the time T6 when the reference period has passed the time T5 when the first output clock signal (CLK_GEN) is generated. The selector 350 outputs the pulse signal (PULSE_OUT) output by the pulse signal generator 320 to the output clock signal (CLK_GEN) according to the high-level modulation control signal (MOD_CON) at the time T6.

The second output clock signal (CLK_GEN) has a modulation period according to the result of performing the modulation operation by the modulator 330. The modulator 330 generates a low-level (i.e., an enable level) modulation control signal (MOD_CON) according to the modulation operation result by the modulator 330 at the time T7.

The pulse signal generator 320 generates a third pulse signal (PULSE_OUT) at the time T8 when the reference period has passed through the time T6 when the second clock signal (CLK_GEN) is generated.

The selector 350 outputs the pulse signal (PULSE_OUT) output by the delay unit 340 to the output clock signal (CLK_GEN) at the time T9 according to the modulation control signal. That is, the pulse signal (PULSE_OUT) is output as an output clock signal (CLK_GEN) at the time T9 which is delayed by one period of the reference clock signal (GCLK) from the time T8 when the pulse signal (PULSE_OUT) is generated.

A third output clock signal (CLK_GEN) has the reference period according to the result of performing the modulation operation by the modulator 330. The modulator 330 generates a high-level (i.e., a disable level) modulation control signal (MOD_CON) at the time T10 according to the modulation result by the modulator 330.

The pulse signal generator 320 generates a fourth pulse signal (PULSE_OUT) at the time T11 which has passed the reference period from the time T9 when the third clock signal (CLK_GEN) is generated.

At the time T11, the selector 350 outputs a pulse signal (PULSE_OUT) output by the pulse signal generator 320 to the output clock signal (CLK_GEN) according to the high-level modulation control signal (MOD_CON). The above-noted operation is repeated until the time T12 when a next input clock signal (CLK_IN[n+1]) is generated (refer to FIG. 4). A falling edge of the input clock signal (CLK_IN[n+1]) is generated at the time T12, and a sync signal (SYNC) is generated at the time T13 when an interval that corresponds to the half of the low level pulse width (CLK_LOW[n]) of the input clock signal (CLK_IN[n]) has passed from the time T12.

At the time T14, the period of the input clock signal (CLK_IN[n+1]) is finished. The operation that is generated during the intervals T4-T12 is repeated starting from the time T13.

In a like manner, the output clock signal with a high frequency can be generated by using the input clock signal with a low frequency without a large capacitor suitable for the low-frequency input signal.

A power supply using a clock signal generating circuit according to an exemplary embodiment of the present invention will now be described.

Figure 6:
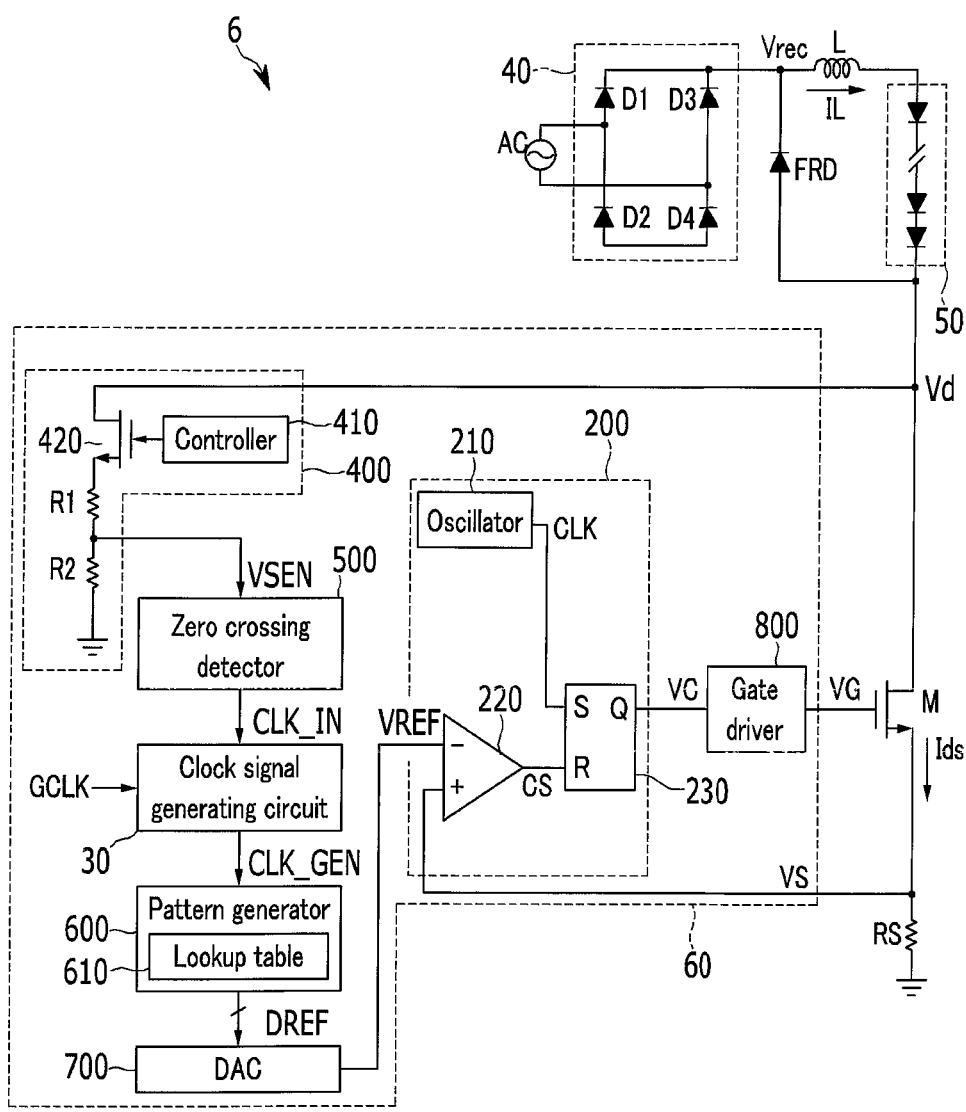
FIG. 6 shows a power supply using a clock signal generating circuit according to an exemplary embodiment of the present invention.

FIG. 6 shows a power supply using a clock signal generating circuit according to an exemplary embodiment of the present invention.

As shown in FIG. 6, the power supply 6 includes a switch control circuit 60 for controlling the power switch (M). The clock signal generating circuit 30 is included in the switch control circuit 60. The switch control circuit 60 generates a reference signal (VREF) according to the output clock signal (CLK_GEN) output by the clock signal generating circuit 30.

The power supply 6 is realized by using a buck converter, and the present invention is not limited thereto. The power supply 6 is set to supply power to an LED string 50 to which a plurality of LED elements are connected in series.

As shown in FIG. 6, the power switch (M) performs switching according to a gate signal (VG) transmitted by the switch control circuit 60. The power switch (M) is realized with an n-channel metal oxide semiconductor field effect transistor (NMOSFET). The present invention is not restricted thereto, and other types of transistors are applicable.

The power supply 6 includes a power switch (M), a bridge diode 40, a diode (FRD), an inductor (L), and the switch control circuit 60. The switch control circuit 60 and the power switch (M) are respectively formed with a single chip, and they can also be formed as a single package.

The bridge diode 40 includes four diodes (D1, D2, D3, and D4), and it full-wave rectifies an input AC power (AC) to generate a full wave rectified voltage (Vrec).

An output terminal of the bridge diode 40 is connected to a first end of the inductor (L). The full wave rectified voltage (Vrec) is supplied to the first end of the inductor (L), and a second end of the inductor (L) is connected to a first end of the LED string 50.

The diode (FRD) is connected to a drain electrode of the power switch (M) and the first end of the inductor (L). The drain electrode of the power switch (M) is connected to a second end of the LED string 50, a source electrode thereof is connected to a first end of the sense resistor (RS), and a gate signal (VG) transmitted by the switch control circuit 60 is input to the gate electrode. The power switch (M) is switched by the gate signal (VG).

When the power switch (M) is turned on, the inductor current (IL) flows through the LED string 50 and the power switch (M). When the power switch (M) is turned off, the inductor current flows to the inductor (L) and the LED string 50 through the diode (FRD). The current (hereinafter, drain current (Ids)) flowing to the power switch (M) flows to the resistor (RS) to generate a sense voltage VS.

The switch control circuit 60 uses a voltage at the input terminal of the power switch (M), that is, a voltage (hereinafter, drain voltage (Vd)) at the drain electrode of the power switch (M), to sense the full wave rectified voltage (Vrec), and detects a zero crossing time of the full wave rectified voltage (Vrec). The switch control circuit 60 generates a reference signal (VREF) having the same phase and size as the full wave rectified voltage (Vrec) by using the detected zero crossing time, and controls the power switch (M) by using the reference signal (VREF) and the switching sensing voltage VS.

A peak envelope of the drain voltage (Vd) has the same phase and frequency as the full wave rectified voltage (Vrec). In detail, when the power switch (M) is turned off by the gate signal (VG), the drain voltage (Vd) follows the waveform of the full wave rectified voltage (Vrec), and when the power switch (M) is turned on by the gate signal (VG), the drain voltage (Vd) is determined by the drain current (Ids) and the sense resistor (RS).

The full wave rectified voltage (Vrec) can be directly sensed without using the drain voltage (Vd).

The switch control circuit 60 includes a voltage sensor 400, a zero crossing detector 500, a clock signal generating circuit 30, a pattern generator 600, a digital-to-analog converter (DAC) 700, a PWM controller 200, and a gate driver 800.

A configuration of the voltage sensor 400 and the zero crossing detector 500 will now be described with reference to FIG. 7.

Figure 7:
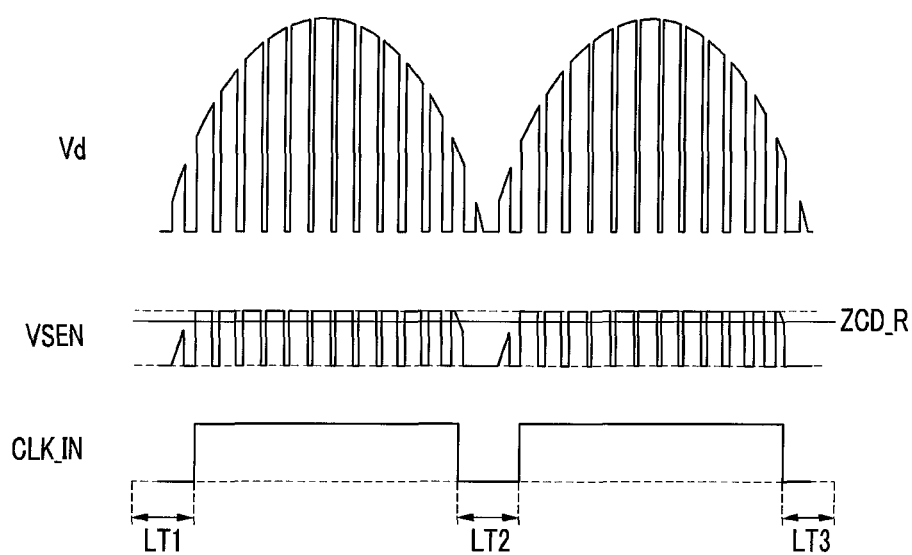
FIG. 7 shows a waveform diagram of a full wave rectified voltage, a sense voltage, and an input clock signal according to an exemplary embodiment of the present invention.

FIG. 7 shows a waveform diagram of a full wave rectified voltage, a sense voltage, and an input clock signal according to an exemplary embodiment of the present invention.

The voltage sensor 400 converts the current that is generated according to the drain voltage (Vd) into a voltage, and clamps the converted voltage with a predetermined level to generate a sense voltage (VSEN).

As shown in FIG. 7, the drain voltage (Vd) is generated to be a waveform that follows the full wave rectified voltage (Vrec) during the turn-off period of the power switch (M).

The voltage sensor 400 includes a JFET 420 for generating a current according to the drain voltage (Vd), a controller 410 for controlling the JFET 420, and two dividing resistors R1 and R2.

A drain electrode of the JFET 420 is connected to the drain voltage (Vd), and a source electrode thereof is connected to a first end of the dividing resistor R1. A second end of the dividing resistor R1 is connected to the dividing resistor R2. The controller 410 turns off the JFET 420 when the drain voltage (Vd) sensed by the JFET 420 is an overvoltage.

The JFET 420 generates a predetermined current in the saturation region so the current following the drain voltage (Vd) does not exceed a predetermined level. The current generated by the JFET 420 flows to the resistor R2, and a sense voltage (VSEN) occurs at the dividing resistor R2.

The voltage sensor 400 shown in FIG. 6 is one example and can be realized in various manners.

The zero crossing detector 500 generates an input clock signal (CLK_IN) according to a result of comparing the sense voltage (VSEN) and the zero crossing reference voltage (ZCD_R). In detail, the zero crossing detector 500 generates the input clock signal (CLK_IN) having a low-level pulse during the intervals LT1, LT2, and LT3 in which the sense voltage (VSEN) is less than the zero crossing reference voltage (ZCD_R).

The voltage sensor 400 can generate a sense voltage (VSEN) by directly sensing the full wave rectified voltage (Vrec) other than the drain voltage (Vd). In this instance, the drain electrode of the JFET 420 is connected to the full wave rectified voltage (Vrec).

Figure 8:
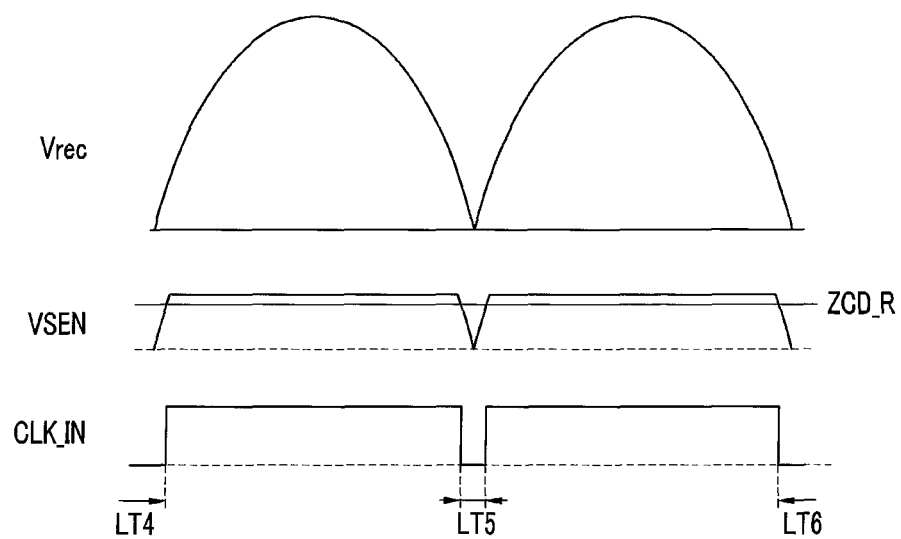
FIG. 8 shows a waveform diagram of a full wave rectified voltage, a sense voltage, and an input clock signal according to an exemplary embodiment of the present invention.

FIG. 8 shows a waveform diagram of a full wave rectified voltage, a sense voltage, and an input clock signal according to an exemplary embodiment of the present invention.

As shown in FIG. 8, the full wave rectified voltage (Vrec) is not changed by switching so the sense voltage (VSEN) represents a waveform that is clamped with the predetermined level without imparting any influence to the switching operation.

The zero crossing detector 500 generates an input clock signal (CLK_IN) having a low-level pulse during the intervals LP4, LP5, and LP6 in which the sense voltage (VSEN) is less than the zero crossing reference voltage (ZCD_R).

The clock signal generating circuit 30 generates an output clock signal (CLK_GEN) by using the input clock signal (CLK_IN) and the reference clock signal (GCLK). The configuration and operation of the clock signal generating circuit 30 have already been described with reference to FIG. 2 to FIG. 5.

The pattern generator 600 generates a digital reference signal (DREF) by using the output clock signal (CLK_GEN). The pattern generator 600 generates the digital reference signal (DREF) that is appropriate for a pattern of the reference signal (VREF) in synchronization with the output clock signal (CLK_GEN). The pattern generator 600 includes a lookup table 610 for storing patterns of the reference signal (VREF).

Examples of the patterns of the reference signal (VREF) include a sine wave, a cosine wave, a sawtooth wave, a ramp wave, an exponential wave, and a logarithmic wave.

The pattern generator 600 uses the lookup table to generate the digital reference signal (DREF) that is configured with digital values indicating voltages that follow the pattern of the reference signal (VREF) for each period of the output clock signal (CLK_GEN). In this instance, the digital reference signal to (DREF) represents an n-bit digital signal.

The DAC 700 generates the reference signal (VERF) according to the digital reference signal (DREF).

FIG. 9 shows a waveform diagram of patterns of a reference signal according to an exemplary embodiment of the present invention.

The reference signal (VREF) of one period is generated according to the output clock signal (CLK_GEN) that occurs for one period PT1 of the input clock signal (CLK_IN).

As shown in FIG. 9, when the reference signal (VREF) is a sine wave, the waveform of the reference signal (VREF) is increased for each period of the output clock signal (CLK_GEN) during the interval PT2, and the waveform of the reference signal (VREF) is reduced for each period of the output clock signal (CLK_GEN) during the interval PT3.

When the reference signal (VREF) is a cosine wave, the waveform of the reference signal (VREF) is reduced for each period of the output clock signal (CLK_GEN) during the interval PT2, and the waveform of the reference signal (VREF) is increased for each period of the output clock signal (CLK_GEN) during the interval PT3.

When the reference signal (VREF) is a sawtooth wave, the waveform of the reference signal (VREF) is linearly reduced for each period of the output clock signal (CLK_GEN) during the interval PT2, and the waveform of the reference signal (VREF) is linearly increased for each period of the output clock signal (CLK_GEN) during the interval PT3.

When the reference signal (VREF) is a ramp wave, the waveform of the reference signal (VREF) is linearly increased for each period of the output clock signal (CLK_GEN) during the interval PT1.

When the reference signal (VREF) is an exponential wave, the waveform of the reference signal (VREF) is exponentially increased for each period of the output clock signal (CLK_GEN) during the interval PT2.

When the reference signal (VREF) is a logarithmic wave, the waveform of the reference signal (VREF) is logarithmically increased for each period of the output clock signal (CLK_GEN) during the period PT2.

The PWM controller 200 includes a PWM comparator 220, an oscillator 210, and an SR latch 230.

The PWM comparator 220 includes a non-inverting terminal (+) for receiving a switching sensing voltage VS and an inverting terminal (−) for receiving the reference signal (VREF). The PWM comparator 220 outputs a high-level comparing signal (CS) when a signal input to the non-inverting terminal (+) is greater than a signal input to the inverting terminal (−), and it outputs a low-level comparing signal (CS) in the other case. The oscillator 210 generates a switching clock signal (CLK) for determining a switching frequency of the power switch (M).

The SR latch 230 generates a gate control signal (VC) according to the switching clock signal (CLK) and the comparing signal (CS). The SR latch 230 includes a set terminal (S) for receiving the switching clock signal (CLK), a reset terminal (R) for receiving the comparing signal (CS), and an output terminal (Q). The SR latch 230 outputs a high-level signal in synchronization with the rising edge of the signal input to the set terminal (S), and outputs a low-level signal in synchronization with the rising edge of the signal input to the reset terminal (R). Therefore, the SR latch 230 generates a high-level gate control signal (VC) in synchronization with the rising edge of the switching clock signal (CLK), and generates a low-level gate control signal (VC) in synchronization with the rising edge of the comparing signal (CS).

The gate driver 800 generates a gate signal (VG) for controlling the power switch according to the gate control signal (VC). The power switch (M) is turned on when the gate signal (VG) is high-level, and the power switch (M) is turned off when the gate signal (VG) is low-level. The gate driver 800 generates a high-level gate signal (VG) according to the high-level gate control signal (VC), and generates a low-level gate signal (VG) according to the low-level gate control signal (VC).

Accordingly, the reference signal can be generated according to the output clock signal generated by the clock signal generating circuit for one period of the input clock signal. Then, the reference signal can be generated without using a large capacitor.

In order to compensate the power factor of the power supply, a reference signal following rectification input of the power supply is needed. In detail, when the switching operation of the power supply is controlled by the reference signal, an input current having a phase and a frequency that are near the rectification input, that is, a full wave rectified input, is needed. Then, the power factor is compensated.

In this instance, a means for sensing the rectification input is needed so as to generate the reference signal. In order to sense the conventional rectification input, a resistance dividing circuit including at least two resistors is used. However, when the resistance dividing circuit is used, the resistors consume power.

Also, when an AC input is varied, the rectification input is varied according to a variation of the AC input to change the form of the reference signal. In order to correct this problem, a circuit for detecting a peak of the rectification input voltage is needed. Then, the size of the circuit for controlling the switching operation of the power supply is increased.

However, when the clock signal generating circuit according to the exemplary embodiment of the present invention is used, resistors for sensing the rectification input and the circuit for detecting the peak of the rectification input voltage are not needed. Accordingly, the size of the switch control circuit for controlling the power supply is reduced, and undesired power consumption is prevented.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A power supply for generating a reference signal by using an input clock signal following a full wave rectified voltage, and controlling a switching operation of a power switch according to the reference signal, comprising:
   a voltage sensor for generating a sense voltage corresponding to the full wave rectified voltage;
   a zero crossing detector for generating the input clock signal according to a result of comparing the sense voltage and a predetermined zero crossing reference voltage; and
   a clock signal generating circuit for generating a quotient and a remainder by dividing a count signal following a result of counting one period of the input clock signal by using a reference clock signal, setting the quotient as a reference period of the output clock signal, and distributing and disposing the remainder to the output clock signal of a plurality of periods occurring for one period of the input clock signal.

2. The power supply of claim 1, wherein
   the clock signal generator sets a plurality of periods of the reference clock signal that correspond to the quotient as a reference period of the output clock signal, and sets a period that corresponds to the remainder from among the plurality of periods of the output clock signal occurring for one period of the input clock signal as a modulation period that is an addition of a period of the reference clock signal to the reference period.

3. The power supply of claim 2, wherein
the clock signal generating circuit includes:
a divider for generating the quotient and the remainder by dividing the count signal by a constant that corresponds to an output frequency of the output clock signal;
a pulse signal generator for generating a pulse signal by using the reference period following the quotient that is input in synchronization with a time when one period of the input clock signal begins;
a modulator for receiving the remainder and the pulse signal, and controlling distribution and disposal of the remainder to the output clock signal according to a result of performing a modulation operation for each period of the pulse signal;
a delay unit for delaying the period of the pulse signal by one period of the reference clock signal, and outputting the same; and
a selector for selecting one of a pulse signal of the pulse signal generator and a pulse signal of the delay unit according to control by the modulator, and outputting it as the output clock signal,
wherein the pulse signal generator generates the pulse signal when the reference period is passed through each period generation time of the output clock signal.

4. The power supply of claim 3, wherein
the modulator performs the modulation operation for each period of the pulse signal and generates a modulation control signal for selecting a period for distributing and disposing the remainder from among a plurality of periods of the output clock signal of the input clock signal according to the modulation result, and
the selector selects one of a pulse signal of the pulse signal generator and a pulse signal of the delay unit according to the modulation control signal.

5. The power supply of claim 4, wherein
the modulator generates a modulation constant by dividing the remainder by the constant, generates a sum of modulation constants by adding the modulation constants for each period of the pulse signal, and generates a modulation control signal for selecting a period of the output clock signal when the sum of the modulation constants is greater than a predetermined value as the modulation period according to the modulation operation.

6. The power supply of claim 1, further including:
a pattern generator for generating a digital reference signal appropriate for a pattern of the reference signal by using the output clock signal; and
a digital-to-analog converter for generating the reference signal according to the digital reference signal.

7. The power supply of claim 6, wherein
the pattern generator includes a lookup table for storing a pattern of the reference signal, and generates the digital reference signal configured with a digital value for indicating a voltage following the pattern of the reference signal for each period of the output clock signal by using the lookup table.

8. The power supply of claim 7, further including
a PWM controller for controlling the switching operation according to a result of comparing a switching sensing voltage that corresponds to the current flowing to the power switch and the reference signal.

9. The power supply of claim 1, wherein
the voltage sensor generates a sense voltage that corresponds to the full wave rectified voltage by using a voltage at an input terminal of the power switch.

* * * * *